United States Patent [19]
Hopper

[11] Patent Number: 6,140,140
[45] Date of Patent: *Oct. 31, 2000

[54] METHOD FOR DETECTING PROCESS SENSITIVITY TO INTEGRATED CIRCUIT LAYOUT BY COMPOUND PROCESSING

[75] Inventor: C. Bradford Hopper, San Francisco, Calif.

[73] Assignee: Advanced Micro Devices, Inc., Sunnyvale, Calif.

[ * ] Notice: This patent is subject to a terminal disclaimer.

[21] Appl. No.: 09/154,075

[22] Filed: Sep. 16, 1998

[51] Int. Cl.⁷ .................................................. H01L 21/00

[52] U.S. Cl. .............................................. 438/8; 438/800

[58] Field of Search .............................. 438/8, 7, 14, 16; 356/394

[56] References Cited

U.S. PATENT DOCUMENTS

6,040,912   9/1998   Zika et al. ............................ 356/394

*Primary Examiner*—Charles Bowers
*Assistant Examiner*—Craig Thompson

[57] ABSTRACT

A method and apparatus that uses compound processing for detecting defects in integrated circuits involves processing two portions of a semiconductor wafer differently according to a first and a second process. The first process and the second process are performed on alternating columns on the wafer. Image subtraction is used to detect differences between the layouts in adjacent columns. After differences are detected, the layout is examined to determine whether the difference represents a defect. If so, the design rules of the layout can be changed to accommodate a wider process variation.

14 Claims, 7 Drawing Sheets

METHOD FOR DETECTING PROCESS SENSITIVITY TO INTEGRATED CIRCUIT LAYOUT BY COMPOUND PROCESSING

BACKGROUND OF THE INVENTION

1. Technological Field of the Invention

The present invention relates to the field of manufacturing products, such as semiconductor chips, and more particularly, to a method and apparatus for detecting systematic pattern defects related to the manufacturing process.

2. Description of Related Art

The manufacturing process of wafers containing semiconductor devices comprises a number of discrete processing steps to produce a semiconductor circuit device from raw semiconductor material. The starting substrate is usually a slice of single crystal silicon referred to as a wafer (FIG. 1) 100 on which a plurality of dies 104 are formed by a semiconductor processing method. There are any number of various semiconductor processing methods, such as etching, epitaxy, oxidation, deposition (e.g., chemical vapor or physical), sputtering, diffusion, ion implantation, chemical mechanical polishing, and lithography, each of which typically has multiple steps. The semiconductor processing methods are used to form regular arrays (FIG. 2A) 106 of integrated circuits. FIG. 2A illustrates that the circuits are typically created in a die, such as 104a, from a plurality of conductive paths 109 which together form a layout structure 108a. These paths may be arranged in regular repeating arrays, as in for example the cache memory of a microprocessor or the core of a memory device, or randomly within the die, as in the primary logic areas of a microprocessor or the controlling logic of a memory device, depending upon their function in the circuit. Layout structures 108a, 108a', 108a" are shown in FIG. 2A only as partial views of the exemplary conductive paths 109 that comprise a randomly laid out area of a much more complicated circuit configuration (not shown). The layout structures 108a may be considered a cell, for purposes of discussion.

Each particular conductive path 109 of layout structure 108a affected differently by the various processing methods. Taking the etching semiconductor method as an example, it is widely known that different design layout structures (generally referred to with numeral 108) have different sensitivities to local etch/polish/masking steps, as well as to variances in the loading and proximity of the structures (i.e. paths 109) to one another. These sensitivities may result in unintended processing errors which produce unwanted effects. Examples of these unwanted effects include a bridge 110 (FIG. 2B) between paths 109 of layout structure 108b that are intended to be separate, an open area 112 (FIG. 2C) between paths 109 of layout structure 108c which are intended to be contiguous, a differential layer thickness (not shown) due to non-uniform polish, an under-etched contact (not shown), or any number of unwanted effects which are hereinafter referred to as "systematic pattern errors".

Although there is a general understanding that areas densely packed with layout structures will, for example, etch differently than loosely packed areas, there is currently no automated means for detecting which areas are most susceptible to systematic pattern errors. This is especially a problem in inherently random structures where the density of layout structures varies such that no particular area can be identified as more problematic than another. This problem is exacerbated by the current state of the art in layout methodology which allows for automated placement of paths 109 (and spaces between the paths) of layout structures 108 to be accomplished using predetermined design rules. If a particular structure 108 which tends to be problematic due to its location next to other structures is not explicitly excluded from a design rule, unwanted failures (e.g., shorts or unconnected contacts) might occur during the actual production of the semiconductor wafer. Further complicating the matter is the fact that the layout engineers may not be aware of the existence of such problems due to the automated layout process mentioned above.

Currently, systematic pattern errors in layout structures randomly placed according to automated design rules can only be found by manual optical inspection or examination of electrical performance of test structures in these areas. Standard automated wafer inspection tools which are useful for detecting non-systematic defects, such as particulate defects or non-repeating improperly formed patterns, cannot be used to find repeating failures like bridge 110 (FIG. 2B).

Figure 2A:
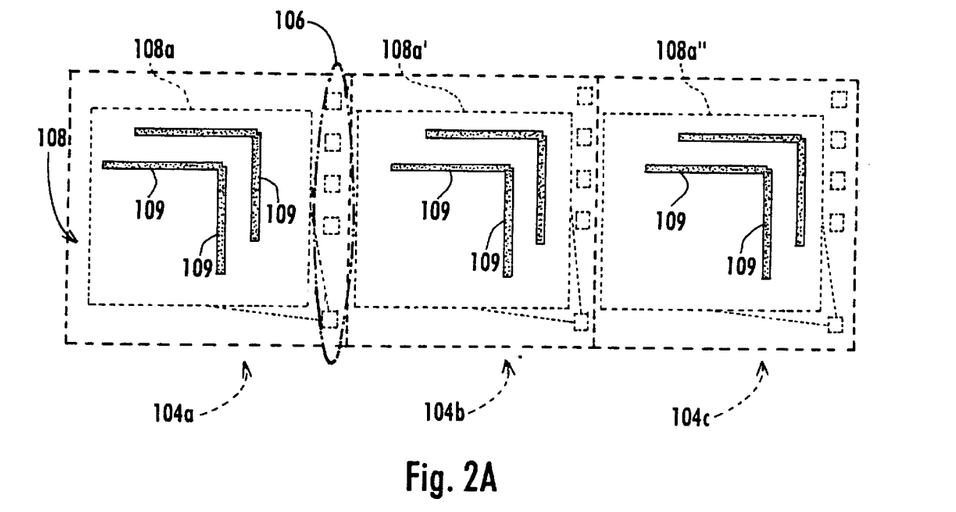
FIG. 2A is a block diagram of a region shown in FIG. 1 illustrating typical layout structures repeated within dies of a semiconductor wafer.
Figure 2B:
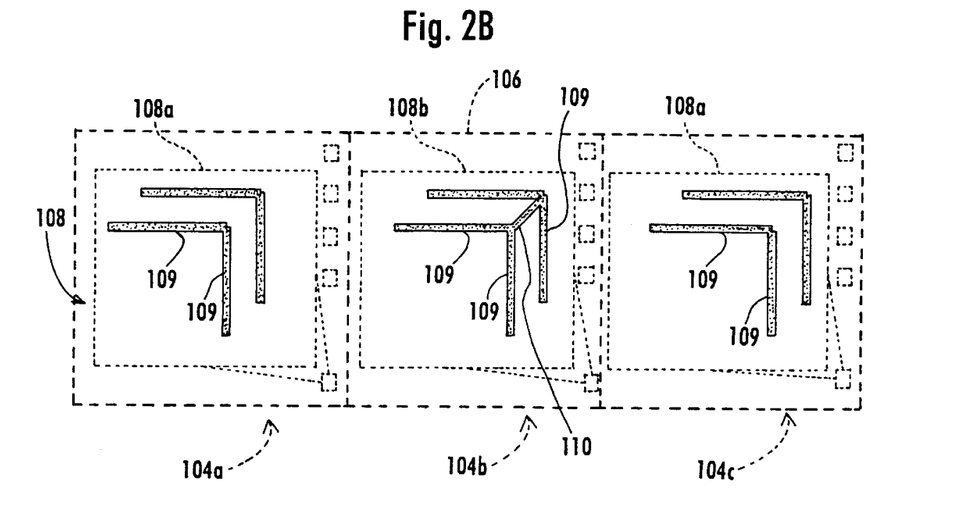
FIG. 2B is a block diagram of a region shown in FIG. 1 illustrating a typical layout structure contained within dies of a semiconductor wafer that has systematic pattern defects.
Figure 2C:
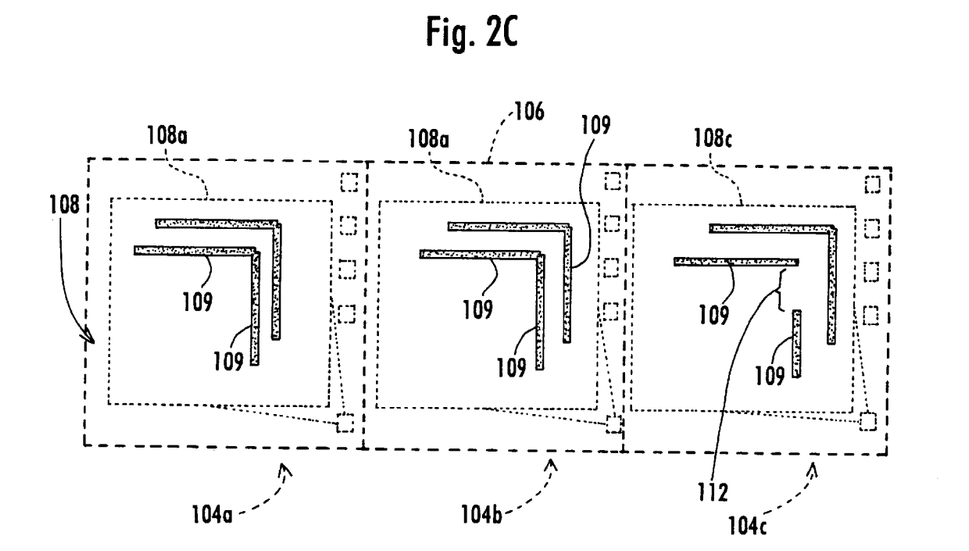
FIG. 2C is a block diagram of a region shown in FIG. 1 illustrating a typical layout structure contained within dies of a semiconductor wafer that has systematic pattern defects.

Turning to FIG. 2B, for example, two paths 109 of layout structure 108a can be randomly laid out by automated design rules repeatedly across dies 104a, 104b, and 104c. If the actual manufacturing process used provides the intended result, the structure will look like 108a. However, if there are variances in the processing method, such as a slightly longer etch time, bridge 110 might be formed to yield structure 108b which would be located in each die 104a, 104b, and 104c. Alternatively, FIG. 2C illustrates the results of an attempt to avoid creating bridge 110. Slightly less etch time was used in FIG. 2C as compared to that used in FIGS. 2A and 2B, but open area 112 is formed to yield structure 108c.

If the automated design rules designed a die with thousands of layout structures intended to be like structure 108a, but the die also included hundreds of thousands of other structures, it is very difficult to determine which of the structures 108a caused a failure. Furthermore, all structures 108a may have errors only when placed adjacent to certain structures, but the automated design rules may have specified this type of failing combination which repeats itself in random locations all across die 104a.

Current state of the art defect inspection tools typically use two image subtraction methods for inspecting areas of integrated circuits. The first, called cell-to-cell, is used when the area being inspected can be subdivided into a small area which contains identical structures 108a laid out in repetitive array 106 such as the core of a memory device or the cache of a microprocessor device. The second, called die-to-die, is used when the area being inspected does not repeat over significant distances and thus cannot be subdivided into identical cells so the entire die 104a is compared to identical dies 104b, 104c, 104d. Die-to-die defect detection is typically used to find random, non-repeating defects.

In cell-to-cell mode, an image of array 106 of the repeating cell structure 108a is acquired and compared to another image of structure 108a in array 106 in a nominally identical neighboring region. These images are compared, and where they differ, the inspection tool identifies that location as a defect. In the case of FIG. 2A, no defect would be detected by this method because no errors exist when comparing the images of identical structures 108a. However, the cell-to-cell mode would detect errors when comparing images of the structures 108a, 108b, 108c in FIG. 2B if those structures were contained in array 106. Specifically, when comparing structure 108a with 108b and 108c, cell-to-cell mode would detect bridge 110 and open area 112. This cell-to-cell defect detection process continues as the entire repeating array 106 is stepped through, comparing each cell to its nearest neighbor and assigning defect locations.

In die-to-die mode, an image of the entire die 104a, or subset thereof, is compared to a nominally identical image in the neighboring die 104b. The same type of image comparison is performed as in the cell-to-cell mode. (smaller portions "swaths" are almost always used to cut down on the memory overhead.)

The two defect detection methods discussed immediately above can be seen to be scaled versions of one another with the requirement that the two images being compared must be substantively identical. Both techniques are useful for detecting particulates, scratches and processing-induced defects like missing features, residual photoresist etc. However, any feature which is present in both images being compared will not be detected, as only differences are detectable. Layout specific process induced defects (e.g., repeating systematic pattern errors) fall into this category.

One of the problems with the existing defect inspection methods is that repeating systematic pattern errors are not detected. This may occur, for example, because image subtraction performed according to either the cell-to-cell or die-to-die methodologies results in no difference between compared images. Without using manual optical inspection or examination of electrical performance of test structures in these areas, the repeating systematic pattern errors remain undetected.

SUMMARY OF THE INVENTION

There is therefore a need for a method and an apparatus for detecting repeating systematic pattern defects in integrated circuits. There is another need for a method and apparatus that does not rely on manual optical inspection or examination of electrical performance of test structures in these areas to detect repeating systematic pattern defects.

The following described method allows the use of these conventional inspection tools to detect layout structures which are sensitive to systematic pattern errors. This information can be used by the design engineer to amend the design rules to disallow the suspected defect causing structures. Iterations of this technique will result in an integrated circuit design which is inherently more manufacturable and a manufacturing process with greater effective capacity.

This and other needs are met by the present invention which provides a method of detecting defects in integrated circuits, comprising applying a first manufacturing process to only a first portion on a starting material, applying a second manufacturing process, different from the first process, to only a second portion on the starting material, and comparing the first and second portions to each other using an image subtraction method of defect detection by subtracting an image of the first portion from an image of the second portion to detect systematic pattern defects present in one of the first and second portions.

The needs are also met by another embodiment of the present invention which provides an arrangement for detecting systematic pattern defects in integrated circuitry on a semiconductor wafer comprising a processing system that performs at least a first and second process on a first and a second portion, respectively, of the semiconductor wafer, wherein the first and second processes are different from one another, and an image subtraction defect detection device which scans the first and second portions to obtain scanned images and subtracts the scanned images of the first and second portions from each other to identify defects in one of the first and second portions.

The needs are also met by another embodiment of the present invention which provides a method of compound processing a wafer having repeating portions with identical layouts to detect systematic pattern defects, comprising processing only a first subset of the portions with a first processing step, processing only a second subset of the portions with a second processing step that is different from the first processing step, comparing a digitized image of one of the portions in the first subset of portions with a digitized image of one of the portions in the second subset of portions, detecting differences between the digitized images based on the comparison of the digitized images, and examining the detected differences to determine whether the detected differences represent systematic pattern defects.

One of the advantages of the present invention is the ability to detect repeating systematic pattern defects which were formerly undetectable using conventional approaches. With the advent of the present invention, the detection of repeating systematic pattern errors does not rely on the use of manual optical inspection or examination of electrical performance of test structures in areas merely suspected of being defective.

Another distinct advantage is the ability to optimize processing of the manufacture of semiconductor wafers by adjusting processing through use of the present invention to identify what stages of processing cause defects.

Yet another advantage of the present invention is that automatic design rules can now be used in conjunction with the present invention to achieve reliable detection of repeating systematic pattern defects caused by the automation.

The present invention also makes defects more visible to inspection devices so that improvements can be made to the design allowing the product to be inherently more manufacturable. This is achieved by making a comparison between the at least two processes, one creating no defect and the other creating a defect. By repeatedly comparing processes after adjusting processing parameters, such as etch time or proximity of structures, the process and design are improved after each iteration to arrive at a better engineered production of the finalized design.

The foregoing and other features, aspects and advantages of the present invention will become more apparent from the following detailed description of the present invention when taken in conjunction with the accompanying drawings.

DETAILED DESCRIPTION OF AN ILLUSTRATIVE EMBODIMENT

The present invention will be described in the context of the manufacture of semiconductor devices. This is exemplary only, however, as the method of the invention is applicable to the manufacture of other types of products produced by one or more processing steps, using an automatically controlled processing tool.

Figure 3:
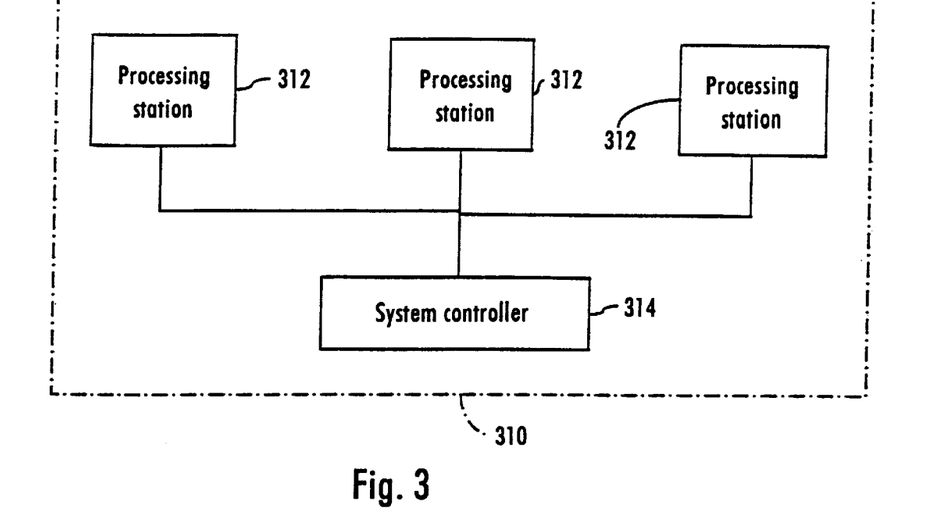
FIG. 3 is a block diagram of a manufacturing arrangement with a plurality of processing stations constructed in accordance with an embodiment of the invention.

FIG. 3 is a block diagram of a processing system 310 constructed in accordance with an embodiment of the present invention. The processing system 310 has a plurality of processing stations that perform different steps of a manufacturing process. A shop floor system controller 314 communicates with the processing stations 312 to control the overall manufacturing processing of, for example, semiconductor wafers 100.

Figure 4:
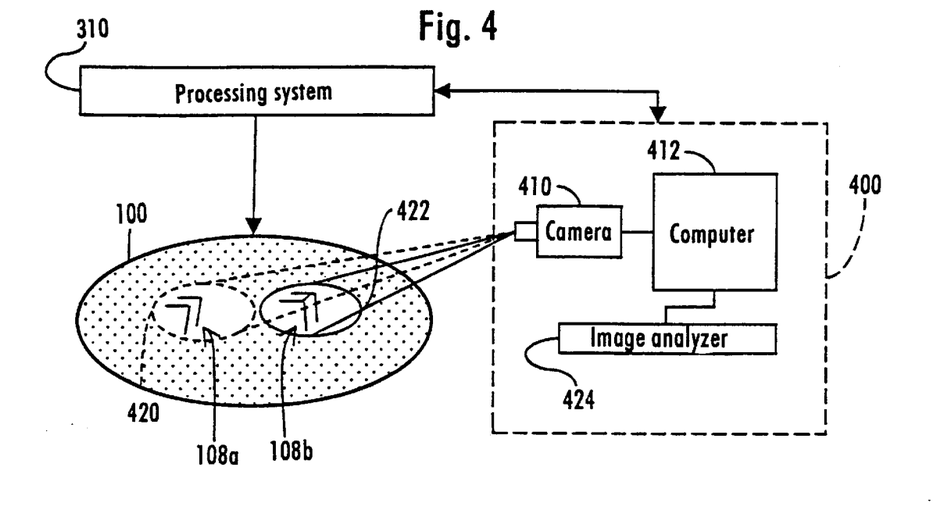
FIG. 4 is a block diagram of a defect detection arrangement constructed in accordance with an embodiment the present invention.

FIG. 4 is a block diagram of a defect detection arrangement constructed in accordance with an embodiment of the present invention. Wafer 100 is shown from a perspective view. In the case of semiconductor processing, processing system 310 performs conventional or state of the art processing operations on wafer 100 as indicated graphically by an arrow. Processing system 310 is also interconnected to an image subtraction defect detection system 400, such as those produced by KLA/Tencor for detecting defects in semiconductor processing as described in more detail below.

Defect detection system 400 includes a camera 410 which is connected to a computer 412 that together operate to gather images of portions of wafer 100. Computer 412 controls camera 410 so that images are gathered of various layout structures (e.g., 108a, 108b) located within wafer 100. Camera 410 focuses on a plurality of portions such as portions 420 and 422. Portion 420 contains structure 108a and portion 422 contains structure 108b. Both portion 420 and 422 could have any number of structures, each of which could contain multiple conductive paths 109 as shown in FIGS. 2A and 2B.

In image subtraction defect detection, each portion 420 having layout structure 108a is compared to a neighboring portion 422 which is intended to include a structure identical to structure 108a. An image analyzer 424 compares the images of the structures intended to be identical, and performs image subtraction to determine if any paths 109 (FIGS. 2A and 2B) exist in one structure that are not present in the other. Image subtraction comprises forming images of each portion, for example using a binary representation where 0 represents background and 1 represents an element (e.g., path 109) detected by the camera, at each pixel location in the field of view of the camera. Subtracting the values at each corresponding pixel location in the two images determines the differences between the images. These differences identify defects or errors that occurred in processing as a result of a defective design, or improper processing carried out by processing system 310.

Figure 5:
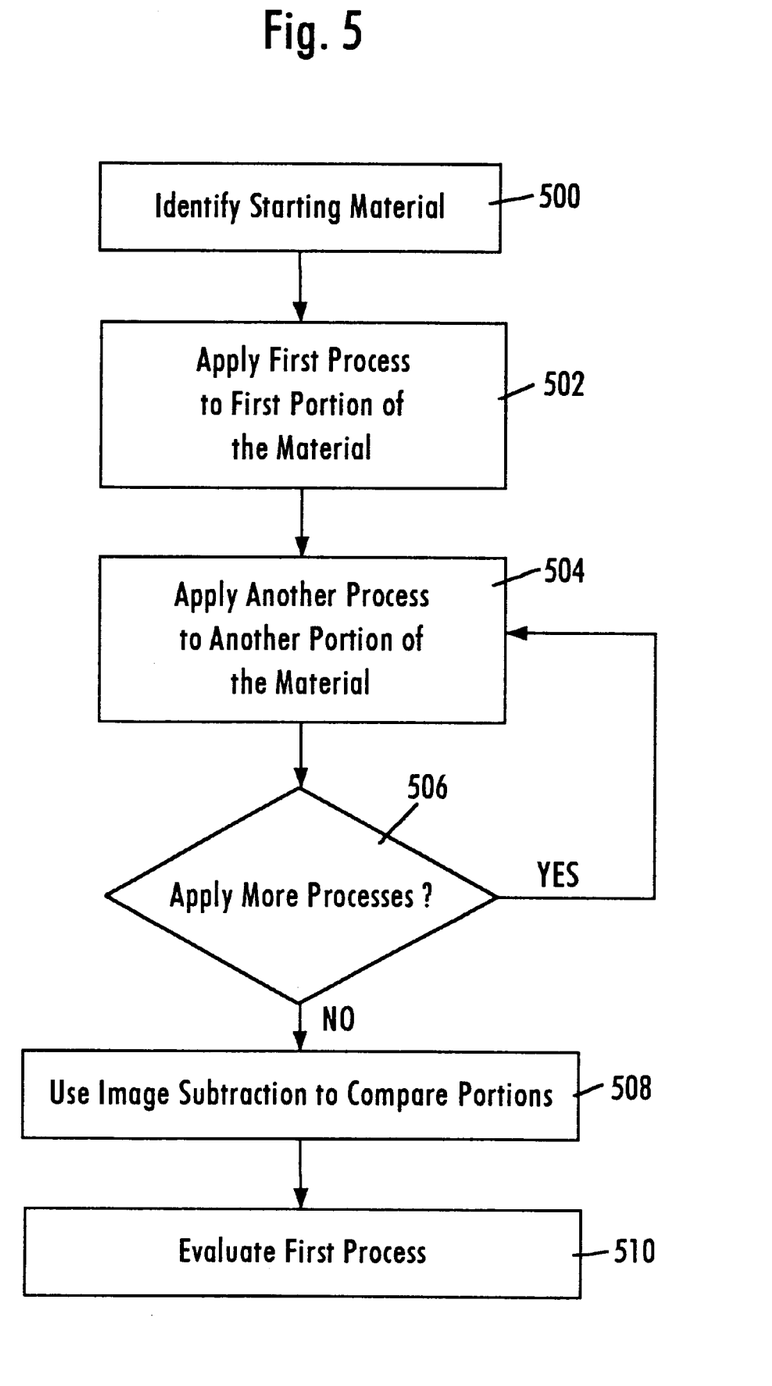
FIG. 5 is a flow chart of a method for performing systematic pattern defect detection in accordance with an embodiment of the present invention.

FIG. 5 is a flow chart of a method carried out in accordance with an embodiment of the present invention. The method is used, for example, for controlling detection of systematic pattern defects that occur in semiconductor processing. In step 500, the starting material (e.g., wafer 100) is identified, and more particularly the portions 420, 422 are selected as locations for comparison.

In step 502, a first process is applied to portion 420. The first process could be any pattern dependent process, and might be considered a test process which will be used as a basis for comparison with other processes. The first process could comprise, for example, a full semiconductor process that includes applying photoresist, exposing the photoresist to a pattern, etching the photoresist away, and stripping the remaining photoresist from the unexposed areas. It should be noted, however, that any individual pattern dependent process step can be carried out in step 502, such as the semiconductor processes of etching, epitaxy, oxidation, deposition (e.g., chemical vapor or physical), sputtering, diffusion, ion implantation, chemical mechanical polishing or lithography, in order to test how the designed pattern is affected by variances in processing steps.

In step 504, a second process which is similar to but different from the first process, is applied to second portion 422 to determine the effects of varying a certain parameter or parameters associated with the first and second processes. For example, the etch time of the first process might be lengthened by 10 seconds in the second process. This may cause bridge 110 (FIGS. 2A and 2B) to form. Alternatively, the etch time might be shortened in the second process to evaluate whether open areas 112 (FIGS. 2A and 2B) are created as compared to the first process applied in step 502. In this way the first process can be evaluated against other processes which are likely to cause defects to determine (i.e., test) if the same defects result from the first process.

Defects that are detected by a comparison of the structures produced by the two processes provide the design engineer with information useful in modifying the layout and design rules. For example, if bridging is detected in dies produced by the second process, then changing the design rules in those areas where the bridging occurs will allow a greater margin in processing variations. This ultimately leads to an increase in yield.

Different parameters from the first process can be changed in performing the second process. In an embodiment of the present invention, the second process typically alters a parameter that is suspected of causing potential defects in such a way so as to intentionally create a defect in portion 422 for later comparison to portion 420.

In step 506, a determination is made as to whether additional processes will be performed on other portions of wafer 100. If more processes are to be applied (506-yes), they are done so at this point. For example, etching time might be further lengthened, or shortened, or other parameters of processes which are likely candidates for causing systematic pattern defects normally undetectable using cell-to-cell defect detection are intentionally employed on other portions within wafer 100. Otherwise, the method continues on (506-no) to step 508. For this example, no additional processes are applied at this time, and the method proceeds to step 508.

By applying a similar but different second process to portion 422, a slightly different structure may be formed in wafer 100. An image subtraction defect detection method is used on wafer 100 in step 508. Step 508 identifies systematic pattern errors that are more likely to occur due to process variation. If there was no variance between the first and second processes, and for example the layout structures were allowed to over etch, both portions 420 and 422 would contain structure 108b which is considered defective because of the presence of unwanted bridge 110 (FIG. 2B). Such a defect would not be detectable by prior art image subtraction defect detection methods since the images are identical. The error in design layout is detectable according to the present invention, by deliberately varying the first and second processes and detecting the difference in the layouts caused by those process variations.

Since structures 108b are typically contained among hundreds of thousands of other structures all within wafer 100, it is very difficult to manually inspect, or electrically test, for individual defects such as bridge 110 which can be caused by repeating systematic pattern defects that occur in both portion 420 and 422. Therefore, in order to determine where potential repeating systematic pattern defects occur, an embodiment of the present invention alters processing between neighboring layout structures by applying the first and second processes. In this way, structure 108b in portion 422 becomes the "control" structure to determine if a defect (bridge 110) appears in portion 420.

In step 510, an evaluation is made as to the viability of the first process based on whether portion 422 has a defect which was produced in structure 108b, but was not located in portion 420. If the defect (bridge 110) is detected in portion 422 that is not in portion 420, then adjustments need to be made either in the design of the structure, or defining of tight margins on the individual processing which produces the structure need to be set. In either case, a potentially repeating systematic pattern defect in a layout structure has been located among thousands of structures, which would have otherwise gone undetected.

Figure 1:
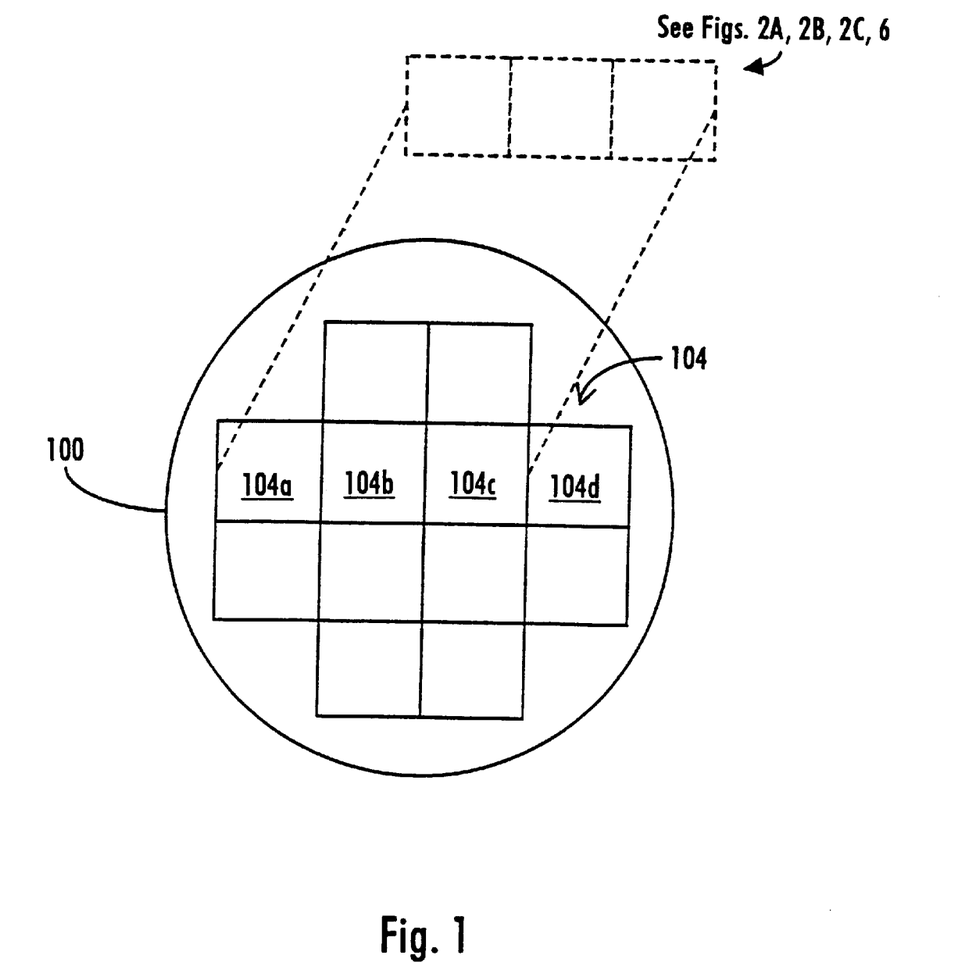
FIG. 1 is a schematic depiction of a semiconductor wafer illustrating regions to be inspected for defects.
Figure 6:
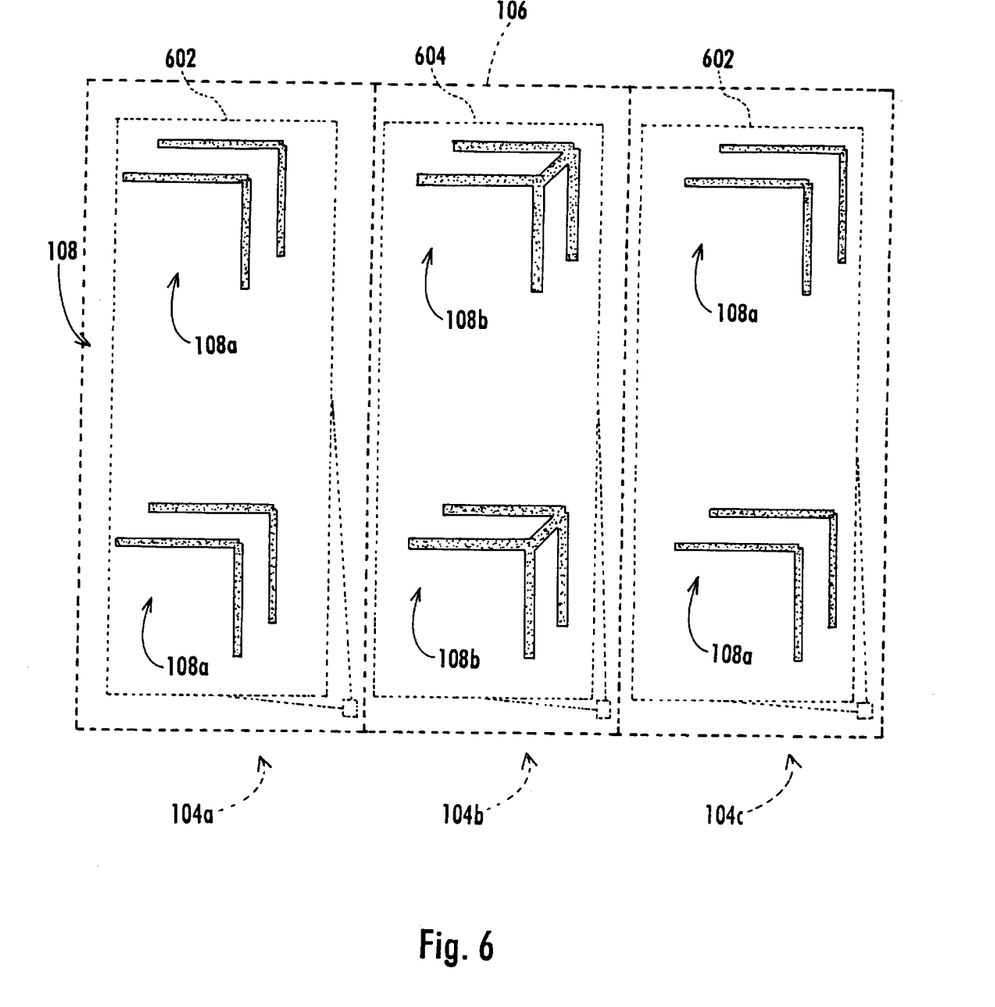
FIG. 6 is a block diagram of a region shown in FIG. 1 illustrating typical layout structures contained within areas of a semiconductor wafer that has systematic pattern defects.

FIG. 6 is a block diagram of a variation of array 106 shown in FIG. 1 which contains a plurality of layout structures 108a contained within a column-type portion 602. Layout structures 108a are arranged in a row or within any other cell shape which facilitates image subtraction defect detection between other cells. The arrangement of FIG. 6 illustrates the convenience of performing systematic pattern defect detection in accordance with the present invention for multiple layout structures 108 at a time. In this way, the results gathered using the methods described above are more reliable since random, non-repeating defects caused by particulate contamination, variances in products density, etc. are possible.

Figure 7:
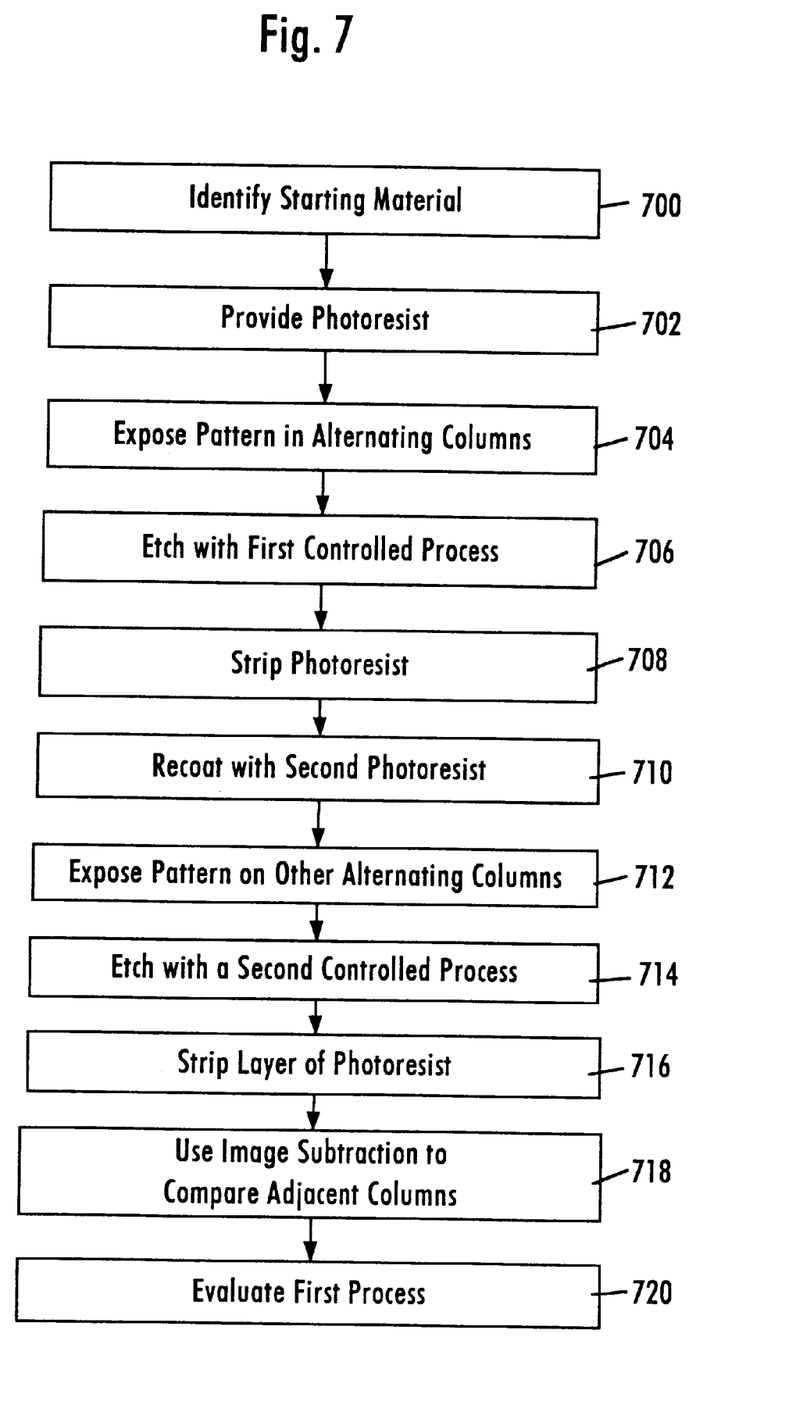
FIG. 7 is a flow chart of an exemplary method for performing semiconductor systematic pattern defect detection in accordance with an embodiment of the present invention.

FIG. 7 is a flow chart of a exemplary method for controlling semiconductor systematic pattern defect detection in accordance with an embodiment of the present invention. In step 700 the starting material is identified, such as wafer 100. If the particular processing step of etching is to be varied between two processes, photoresist is applied over wafer 100 at step 702. In step 704, a pattern is exposed in alternating strips or columns like that shown in portion 602 of FIG. 6. The preferred method is to expose the pattern in alternating columns, although a different number of columns are skipped in other embodiments of the invention to apply the selected number of different processes. In step 706, the alternating portions 602 are etched with the first controlled process. In step 708, the photoresist is stripped which forms the resulting layout structures 108a.

The second process is then performed, beginning with step 710 during which the entire wafer 100 is recoated with photoresist. In step 712, the other alternating columns are exposed to the same pattern used in step 704. For example, only the odd columns may be patterned and etched in steps 704, 706 and only the even columns etched in steps 712, 714. A second controlled process which is similar but different from the first controlled process performed in step 706, is applied in step 714 to the other alternating column to determine if any defects are caused by the process variation. In step 716, the photoresist is stripped from wafer 100 leaving alternating columns 602, 604 (FIG. 6) which are compared using image subtraction defect detection in step 718.

Assuming that the dies or structures to be compared are arranged in alternating columns, as depicted in FIG. 6, scanning by camera 410 is performed across the columns, in a row. Alternatively, if the structures to be compared are varied row by row, then the scanning is performed in a column-wise manner.

When the image subtraction defect detection method detects a defect in a column, which does not therefore appear in the adjacent column (assuming row-by-row scanning), the layout of the design at which the defect appears may then be examined. In order to provide a larger processing margin, the design rules may be altered to avoid the defect in future layouts of the circuit.

Although the present invention has been described with the example of semiconductor wafer manufacturing applying an etching technique, the invention is applicable to identifying defects and variations caused by processing differences in other types of manufacturing techniques, such as epitaxy, oxidation, deposition (chemical vapor, physical), sputtering, diffusion, ion implantation, lithography.

The present invention allows image subtraction to be used to detect repeating systematic pattern defects that would otherwise go undetected without impractical manual inspection techniques. Through using the present invention over multiple iterations, semiconductor design of layout structures can be improved dramatically by confirming that the automatically designed layout actually produces the intended result after processing. The resultant semiconductor design is more manufacturable due to the leeway introduced by refining the layout structures and the processing that affects them.

Although the present invention has been described and illustrated in detail, it is to be clearly understood that the same is by way of illustration and example only, and is not to be taken by way of limitation, the spirit and scope of the present invention being limited only by the terms of the appended claims.

What is claimed is:

1. A method of detecting defects in integrated circuits, comprising:

applying a first manufacturing process to only a first portion on a starting material;

applying a second manufacturing process, different from the first process, to only a second portion on the starting material; and comparing the first and second portions to each other using an image subtraction method of defect detection by subtracting an image of the first portion from an image of the second portion to detect systematic pattern defects present in one of the first and second portions.

2. The method of claim 1, wherein the first and second portions are arranged in respective alternating columns on the starting material.

3. The method of claim 2, wherein the step of comparing the first and second portions includes scanning across the alternating columns, storing the image of the first portion in one of the alternating columns, and comparing the stored image of the first portion with the image of the second in an adjacent one of the alternating columns.

4. The method of claim 1, further comprising examining a circuit layout of the first or second portion at a location at which the defect is detected.

5. The method of claim 4, further comprising altering design rules as a function of the examination of the circuit layout at the location at which the defect is detected.

6. The method of claim 1, wherein the first manufacturing process comprises:
   providing a first layer of photoresist on semiconductor material;
   exposing a first pattern in first alternating columns;
   etching the first pattern with a first controlled process to create the first portions; and
   stripping the remaining first layer of photoresist.

7. The method of claim 6, wherein the second manufacturing process comprises:
   applying a second layer of photoresist on semiconductor material following stripping of the first layer of photoresist;
   exposing the first pattern in second alternating columns;
   etching the first pattern with a second controlled process which is different from the first controlled process to create the second portions; and
   stripping the second layer of photoresist remaining after etching with the second controlled process prior to the step of comparing the first and second portions to each other.

8. A method according to claim 1, wherein the first and second portions are cells within a die.

9. The method according to claim 1, wherein the first and second portions are dies.

10. A method of compound processing a wafer having repeating portions with identical layouts to detect systematic pattern defects, comprising the steps of:
    processing only a first subset of the portions with a first processing step;
    processing only a second subset of the portions with a second processing step that is different from the first processing step;
    comparing a digitized image of one of the portions in the first subset of portions with a digitized image of one of the portions in the second subset of portions;
    detecting differences between the digitized images based on the comparison of the digitized images; and
    examining the detected differences to determine whether the detected differences represent systematic pattern defects.

11. The method of claim 10, wherein processing the first subset and processing the second subset occurs separately from each other by masking one subset while the other is being processed.

12. The method of claim 10, further comprising arranging the first and second subsets of portions in alternating first and second columns, respectively.

13. The method of claim 12, further comprising obtaining digitized images of the alternating first and second columns by scanning across the columns.

14. The method of claim 10, further comprising altering the design rules to avoid creating systematic pattern defects, after detecting the differences and determining that the detected differences represent systematic pattern defects.

* * * * *